United States Patent
D'Luna et al.

(10) Patent No.: US 7,430,680 B2
(45) Date of Patent: Sep. 30, 2008

(54) SYSTEM AND METHOD TO ALIGN CLOCK SIGNALS

(75) Inventors: Lionel J. D'Luna, Irvine, CA (US); Thomas A. Hughes, Irvine, CA (US); Sathish Kumar Radhakrishnan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 685 days.

(21) Appl. No.: 11/169,006

(22) Filed: Jun. 29, 2005

(65) Prior Publication Data

US 2006/0156907 A1   Jul. 20, 2006

Related U.S. Application Data

(60) Provisional application No. 60/644,437, filed on Jan. 19, 2005.

(51) Int. Cl.
*H03L 7/06* (2006.01)

(52) U.S. Cl. .................. 713/400; 713/401; 711/167; 375/354; 375/371; 375/373; 375/376; 365/233.1; 365/233.11; 365/233.12; 365/233.13; 327/141; 327/156; 327/158

(58) Field of Classification Search ................ 713/400, 713/401; 711/167; 375/354, 371, 373, 376; 365/233.1, 233.11, 233.12, 233.13; 327/141, 327/156, 158

See application file for complete search history.

(56) References Cited

U.S. PATENT DOCUMENTS

| | | | |
|---|---|---|---|
| 5,402,168 A * | 3/1995 | Fouilloy ..................... 348/164 |
| 5,485,490 A | 1/1996 | Leung et al. |
| 6,256,361 B1 * | 7/2001 | Mozetic et al. ............. 375/360 |
| 6,604,204 B1 * | 8/2003 | Ozdemir et al. ............. 713/400 |
| 6,671,754 B1 * | 12/2003 | Farwell ....................... 710/61 |
| 6,707,728 B2 | 3/2004 | Lee |
| 6,822,924 B2 | 11/2004 | Lee |
| 6,975,557 B2 | 12/2005 | D'Luna et al. |
| 2001/0025350 A1 | 9/2001 | Hohler et al. |
| 2003/0035502 A1 | 2/2003 | Boerker |
| 2007/0262798 A1 * | 11/2007 | Yun et al. ................... 327/158 |
| 2008/0007309 A1 * | 1/2008 | Kim .......................... 327/149 |

* cited by examiner

*Primary Examiner*—Abdelmoniem Elamin
(74) *Attorney, Agent, or Firm*—Sterne Kessker Goldstein Fox PLLC

(57) ABSTRACT

A system and method use an aligning device to align clock signals of two logic devices before data transfer between them. In this example, the aligning device aligns a clock signal of a sequencer with a clock signal of a storage device before the sequencer transfers data to the storage device. The aligning device includes a phase detector that receives a first reference clock signal, which is used to control the storage device, and a delayed signal, which is used to control the sequencer, and generates a comparison clock signal. The comparison clock signal is filtered before being used to control a phase of a second reference clock signal, which is related to the first reference clock signal. The phase controlled second clock signal is an aligning clock signal that is feed back to a delay device to produce one or more subsequent delay device clock signals that are aligned to the storage device clock or first reference clock signal. These subsequent delay device clock signals are transmitted to the aligning device and to the sequencer before each transfer occurs.

18 Claims, 5 Drawing Sheets

SYSTEM AND METHOD TO ALIGN CLOCK SIGNALS

This application claims benefit under 35 U.S.C. §119(e) to U.S. Provisional Patent Application No. 60/644,437, filed Jan. 19, 2005, which is incorporated by reference herein in its entirety.

BACKGROUND

1. Field

The present invention is related to aligning a sequencer clock and a buffer clock before transferring data to a buffer.

2. Related Art

Typically, logic devices are under control of different clocks. Data cannot be efficiently transferred from a first logic device to a second logic device if the clocks are not aligned or skewed. Thus, to properly transfer or write the data from the first logic device to the second logic device, the clocks need to be aligned. One way to align clocks before transferring or writing is to use a deskewing phase lock loop that receives both clock signals, and aligns a signal from a data receiving device with respect to a data sending device. However, the deskewing phase lock loop typically occupies a lot of real estate on a chip. With chips being required to include more and more devices, this additional space becomes costly.

Therefore, what is needed is a system and method that would allow for proper aligning of clock signals of devices sharing data using a device that takes up less real estate on a chip than a deskewing phase lock loop.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
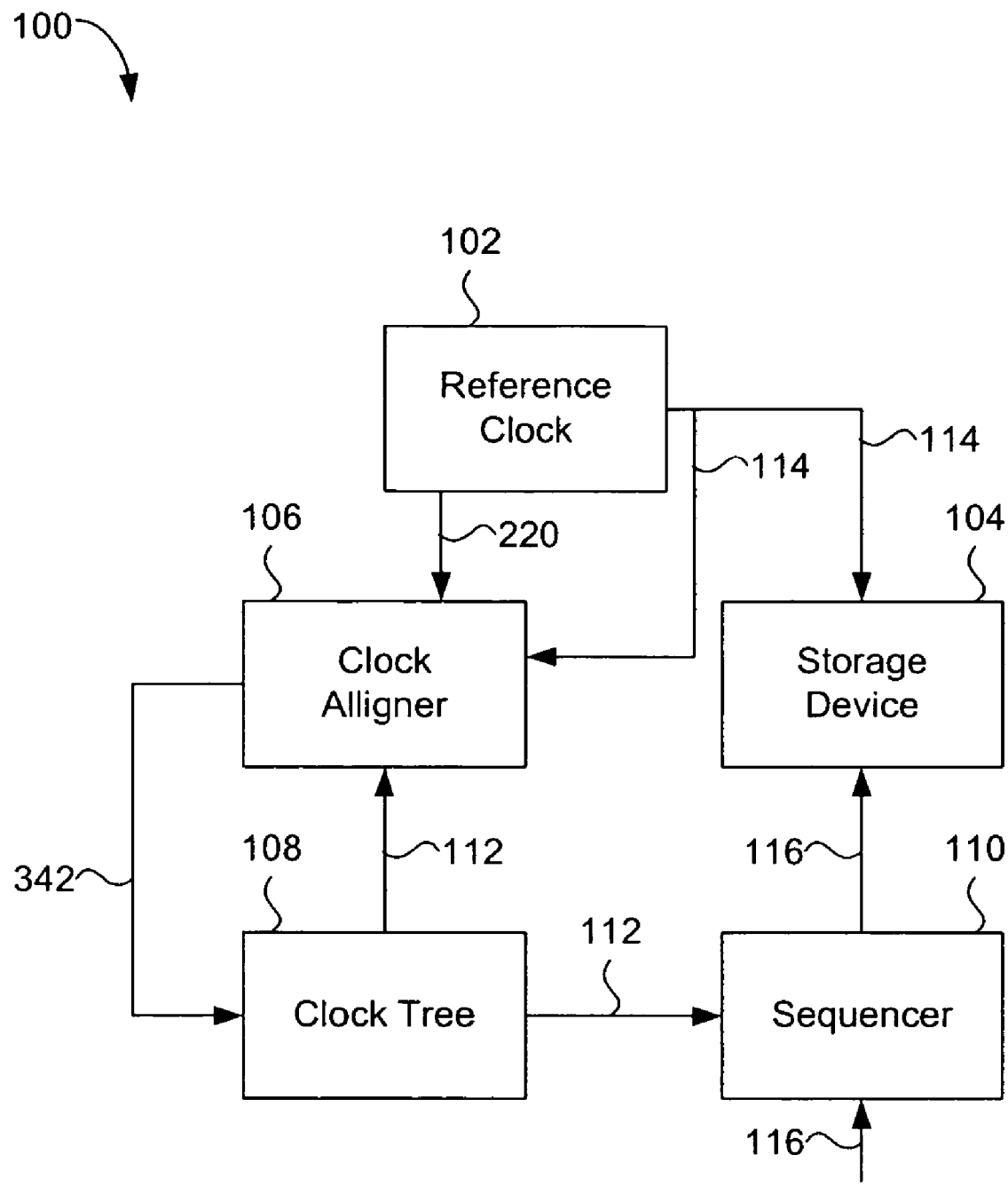
FIG. 1 shows a system, according to one embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

In one or more embodiments of the present invention a system and method utilize an aligning device for aligning clock signals of two logic devices before data transfers between them. In this example, the aligning device aligns a clock signal of a sequencer with a clock signal of a storage device before the sequencer writes data to the storage device. The aligning device includes a phase detector that receives a first reference clock signal, which is used to control the storage device, and a delayed signal, which is used to control the sequencer, and generates a comparison clock signal. The comparison clock signal is filtered before being used to control a phase of a second reference clock signal, which is related to the first reference clock signal. The phase controlled second clock signal is an unaligned clock signal or a skewed clock signal that is feed back to a base of a delay device to produce one or more subsequent delay device clock signals that are aligned with the first reference clock signal. These subsequent delay device clock signals are transmitted to the aligning device and to the sequencer before each write occurs.

In one example, the aligning device can take up less real estate on a chip than a deskewing phase lock loop, allowing for an increase in the number of devices that can be formed on the chip.

FIG. 1 shows a system 100, according to one embodiment of the present invention. System 100 includes a reference clock 102, a storage device 104 (e.g., a buffer), an aligning device 106 (e.g., a clock aligner or a deskewer), a delay device 108 (e.g., a clock tree, which example is shown throughout the figures), and a sequencer 110. For example, system 100 can be used to align a sequencer clock signal 112 with a storage device clock signal 114 before data 116 is written to storage device 104 from sequencer 110. The aligning is performed through adjustment of reference clock signal 220 (FIG. 2) by comparing a first reference clock signal 114 (FIG. 1) from reference clock 102, and clock signal 112 from delay device 108 in aligning device 106 to generate an aligning clock signal 342 (FIG. 3), which operation is described in more detail below with respect to FIG. 3. Aligning clock signal 342 is fed to delay device 108, and is used to generate subsequent clock signals 112, which are sequentially transmitted to sequencer 110 and aligning device 106. Thus, aligning device 106 can be used to ensure that one or more sequential clock signals 112 are aligned with clock signal 114 (e.g., in phase with each other), so that robust writing of data between sequencer 110 and storage device 104 can occur.

Figure 2:
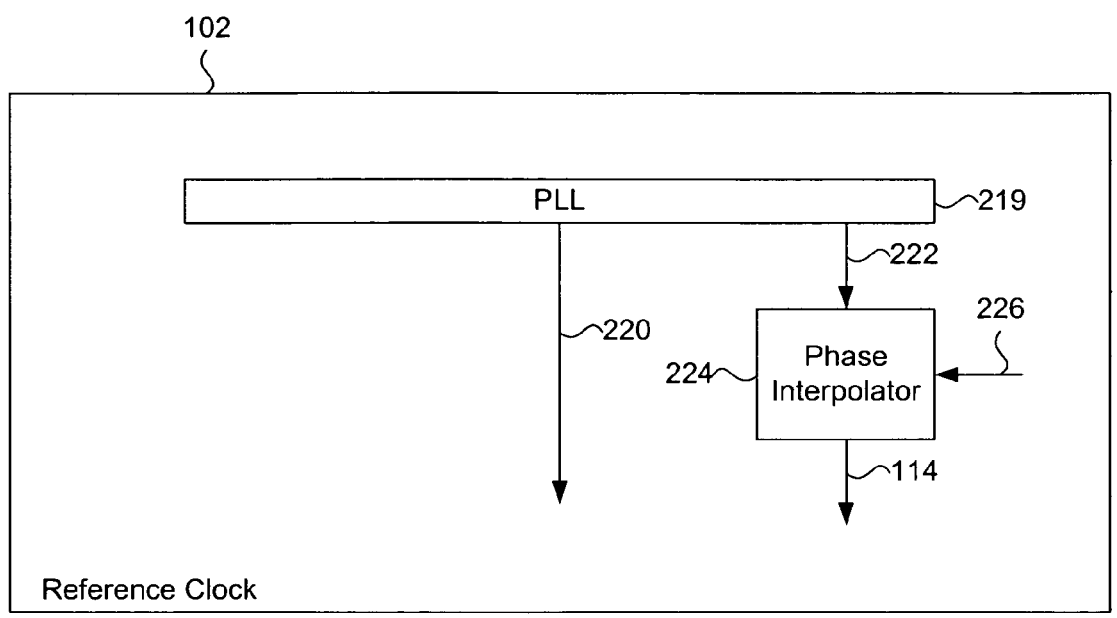
FIG. 2 shows a reference clock, according to one embodiment of the present invention.

FIG. 2 shows reference clock 102, according to one embodiment of the present invention. In this embodiment, reference clock 102 includes a phase lock loop 219 (PLL 219) that generates at least the first reference clock signal 220 and second reference clock signal 222. It is to be appreciated, more reference clock signals can also be generated, depending on a desired application using PLL 219. In one example, first and second reference clock signals 220 and 222 have a same amplitude and frequency, but have a different phase.

As seen in FIG. 1, first reference clock signal 220 is received at aligning device 106. As seen in FIG. 2, second reference clock signal 222 is phase adjusted using phase interpolator 224 under control of a phase control signal 226 to generate storage device clock signal 114, which as discussed above, is received at storage device 104 and aligning device 106. In another example, second reference clock signal 222 is directly transmitted to storage device 104 without any phase adjustment.

Figure 3:
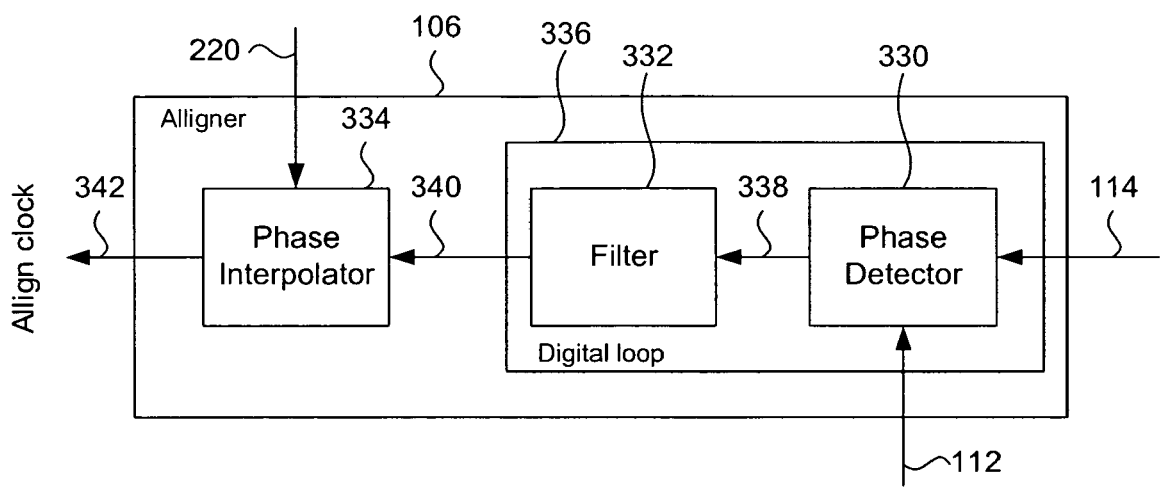
FIG. 3 shows an aligning device, according to one embodiment of the present invention.

FIG. 3 shows aligning device 106, according to one embodiment of the present invention. Aligning device 106 includes a phase detector 330, a filter 332, and a phase interpolator 334. In one example, phase detector 330 and filter 332 form a digital loop 336. Phase detector 330 receives storage device clock signal 114 and delay device clock signal 112, and determines a phase difference between the two to form a comparison signal 338. Filter 332 filters comparison signal 338 to form filtered comparison signal 340 (e.g., phase interpolator control value). Filtered comparison signal 340 is transmitted to phase interpolator 334. Phase interpolator 334 uses signal 340 to control a phase of phase interpolator 334. Controlling of the phase of phase interpolator 334 allows for adjustment of first reference clock signal 220 to form aligning clock signal 342. With reference to FIG. 1, aligning clock signal 342 is feed to delay device 108, and is used to generate the one or more subsequent delay device clock signals 112, which are aligned with storage clock 114.

In one example, phase detector 330 is a single flip-flop with a D input being signal 112 and a clock input being signal 114. Phase detector 330 can have an output every clock cycle. In one example, digital loop filter 332 operates at one fourth of this frequency. Thus, only one sample out of four from phase detector 330 is required. In order to avoid any bias, the sample can be selected by a register programmable value that can select the sample from one out of the four possible samples. This selection process can use a flip-flop that minimizes any metastability issues by allowing one full clock cycle. This value is further flopped on the falling edge of clock signal 114 for a safe handoff to the ¼ clock.

In one example, loop filter 332 accumulates phase detector flip-flop values 1 or 0, which are assigned as values +/−1 until the accumulation reaches a register programmable threshold value. For example, this programmable threshold value can be a power of 2. In one example, a positive threshold is 2n and a negative threshold is the 1's complement, −2n−1. The programmable value "n" can be a 4-bit number between 0 and 9. If the phase skew is between −180° and 0° then, when the threshold value of 2n is reached, phase interpolator control value 340 is increased by 1, moving the phase of a subsequent clock signal 112, through phase adjusting of first reference signal 220, and thus aligning clock signal 342, forward by one phase resolution of phase interpolator 334 (i.e., deskewing toward 0° phase alignment). Similarly if the phase skew is between 0° and +180° then, when the threshold value of−2n−1 is reached, the phase interpolator control value 340 (i.e., filtered comparison signal 340) is decreased by 1, moving a phase of a subsequent clock signal 112, through phase adjusting of first reference clock signal 220, and thus aligning clock signal 342, backward by one phase resolution of phase interpolator 334 (i.e., deskewing toward 0° phase alignment). Control value 340 for phase interpolator 334 is incremented or decremented by only one step at a time. In one example, phase interpolator 334 provides substantially glitchless phase changes for unit changes in control value 340.

Figure 4:
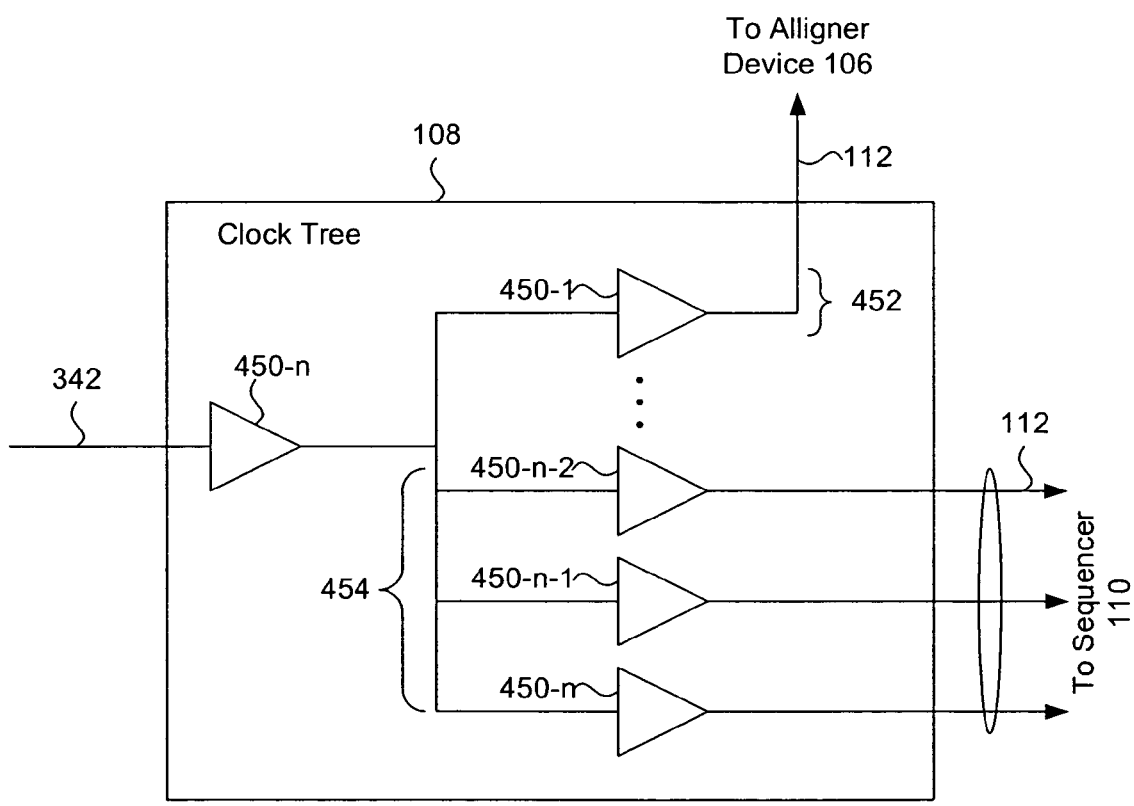
FIG. 4 shows a delay device, according to one embodiment of the present invention.

FIG. 4 shows delay device 108, according to one embodiment of the present invention. Delay device 108 includes a plurality of delay devices 450-n (n being an integer equal to or greater than 1). In one example, a first set of delay devices 452, for example, 450-1, at a first segment of delay device 108 is used to generate one or more first versions of clock signals 112, which are transmitted to aligning device 106 after each receipt of subsequent aligning clock signal 342. Also, in this example, a second set of delay devices 454, for example 450-n, 450-n-1, and 450-n-2, at a second segment of delay device 108 is used to generate one or more second versions of clock signals 112 that are transmitted to sequencer 110 after each receipt of subsequent aligning clock signal 342. In this arrangement, a delay caused by delay device 108 allows for proper alignment of clock signal 112 and clock signal 114 so that robust writing of data between sequencer 110 and storage device 104 can occur. In one example, first and second versions of clock signals 112 can have the same characteristics, and first and second segments are a same segment.

Figure 5:
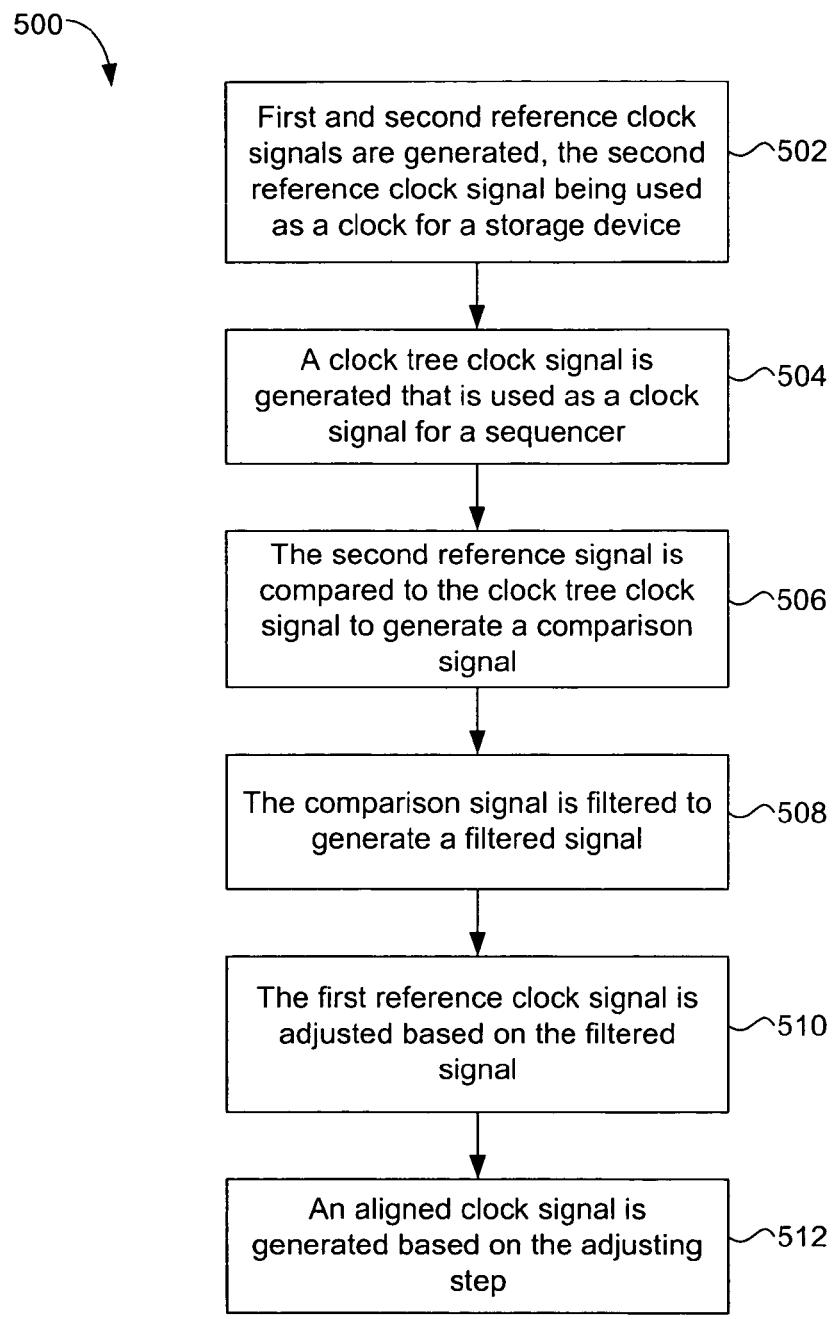
FIG. 5 shows a flowchart depicting a method, according to one embodiment of the present invention.

FIG. 5 shows a flowchart depicting a method 500, according to one embodiment of the present invention. In step 502, first and second reference clock signals are generated, the second reference clock signal being used as a clock for a storage device. In step 504, a delay device clock signal is generated that is used as a clock signal for a sequencer. In step 506, the second reference signal is compared to the delay device clock signal to generate a comparison signal. In step 508, the comparison signal is filtered to generate a filtered signal. In step 510, the first reference clock signal is adjusted based on the filtered signal. In step 512, an aligning clock signal is generated based on the adjusting step. In one example, the aligning clock signal is used to generate subsequent ones of the delay device clock signal aligned with the second reference clock signal. The comparing, filtering, and adjusting steps are used to allow for robust writing of data from the sequencer to the storage device.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

What is claimed is:

1. A system, comprising:
    a reference clock that generates first and second clock signals;
    a delay device that generates a third clock signal;
    an aligning device that receives the first, second, and third clock signals and generates a fourth clock signal based on a relationship between the first, second, and third clock signals, the fourth clock signal being fed back to the delay device and used to produce subsequent ones of the third clock signals;

a sequencer that sequentially receives the third clock signals; and a storage device that receives the second clock signal from the reference clock, wherein the aligning of the second clock signal and the third clock signal is used to allow for writing of data from the sequencer to the storage device.

2. The system of claim 1, wherein the reference clock comprises:

a phase lock loop that generates the first clock signal and a fifth clock signal; and a phase interpolator that modifies the fifth clock signal to produce the second clock signal.

3. The system of claim 1, wherein the delay device comprises:

a delay device that receives the fourth clock signal;

a delay device in a first segment of the delay device; and a set of delay devices in a second segment of the delay device, wherein the first segment of the delay device generates a version of the third clock signal, based on the fourth clock signal, that is transmitted to the aligning device, and wherein the second segment of the delay device generate versions of the third clock signal, based on the fourth clock signal, which are transmitted to the sequencer.

4. The system of claim 3, wherein the first and second segments are a same segment of the delay device.

5. The system of claim 1, wherein the aligning device comprises:

a phase detector that receives the second clock signal and the third clock signal and generates a comparison clock signal;

a filter that receives the comparison clock signal and generates a filter clock signal therefrom; and a phase interpolator that modifies the first clock signal based on the filtered clock signal to produce the fourth clock signal.

6. The system of claim 5, wherein the filter filters the comparison clock signal using a threshold value to produce the filter clock signal.

7. The system of claim 5, wherein the phase interpolator uses the filter clock signal to control a phase of the first clock signal.

8. The system of claim 1, wherein the first and second clock signals vary in phase with respect to each other.

9. A method, comprising:

(a) generating first and second reference clock signals, the second reference clock signal being used as a clock for a storage device;

(b) generating a delay device clock signal that is used as a clock signal for a sequencer;

(c) comparing the second reference signal to the delay device clock signal to generate a comparison signal;

(d) filtering the comparison signal to generate a filtered signal;

(e) adjusting the first reference clock signal based on the filtered signal;

(f) generating an aligning clock signal based on step (e); and (g) using the aligning clock signal to generate subsequent ones of the delay device clock signal that are aligned to the second clock signal, wherein steps (c)-(g) are used to allow for transferring of data from the sequencer to the storage device.

10. The method of claim 9, wherein step (a) comprises:

using a phase lock loop to generate the first reference clock signal and a third reference clock signal; and using a phase interpolator to modify the third reference clock signal to produce the second reference clock signal.

11. The method of claim 9, wherein step (b) comprises:

delaying the aligning clock signal;

generating a first version of the delay device clock signal from the delayed aligning clock signal, which is used in step (c); and generating a second version of the delay device clock signal from the delayed aligning clock signal, this is transmitted to the sequencer.

12. The method of claim 9, wherein step (d) comprises using a threshold value to filter the comparison clock signal.

13. The method of claim 9, wherein the first and second clock signals are one of varied or unvaried in phase with respect to each other.

14. A system, comprising:

a reference clock;

a delay device;

an aligning device coupled to an input of the delay device, first and second outputs of the reference clock, and a first output of the delay device;

a sequencer coupled to a second output of the delay device; and a storage device coupled to the second output of the reference clock and an output of the sequencer.

15. The system of claim 14, wherein the reference clock comprises:

a phase lock loop coupled to the aligning device; and a phase interpolator coupled between the phase lock loop and the storage device.

16. The system of claim 14, wherein the delay device comprises:

a delay device coupled to the aligning device;

a delay device in a first segment of the delay device coupled between the delay device and the aligning device; and a set of delay devices in a second segment of the delay device coupled between the delay device and the sequencer.

17. The system of claim 16, wherein the first and second segments are a same segment.

18. The system of claim 14, wherein the aligning device comprises:

a phase detector coupled to the second output of the reference clock and the output of the delay device;

a filter coupled to the phase detector; and a phase interpolator coupled to the first output of the reference clock, the filter, and the input of the delay device.

* * * * *